United States Patent
Clerk et al.

(10) Patent No.: US 11,671,063 B2
(45) Date of Patent: Jun. 6, 2023

(54) OPTIMALLY DETUNED PARAMETRIC AMPLIFICATION, AND ASSOCIATED DEVICES

(71) Applicant: The University of Chicago, Chicago, IL (US)

(72) Inventors: Aashish Clerk, Chicago, IL (US); Alexander McDonald, Chicago, IL (US)

(73) Assignee: The University of Chicago, Chicago, IL (US)

( * ) Notice: Subject to any disclaimer, the term of this patent is extended or adjusted under 35 U.S.C. 154(b) by 0 days.

(21) Appl. No.: 17/756,481

(22) PCT Filed: Dec. 13, 2020

(86) PCT No.: PCT/US2020/064735
§ 371 (c)(1),
(2) Date: May 26, 2022

(87) PCT Pub. No.: WO2021/119570
PCT Pub. Date: Jun. 17, 2021

(65) Prior Publication Data
US 2023/0020178 A1  Jan. 19, 2023

Related U.S. Application Data

(60) Provisional application No. 62/948,147, filed on Dec. 13, 2019.

(51) Int. Cl.
*H03F 7/04* (2006.01)
*H03F 19/00* (2006.01)
(Continued)

(52) U.S. Cl.
CPC ............ *H03F 7/04* (2013.01); *G02F 1/31* (2013.01); *G02F 1/392* (2021.01); *H03F 3/189* (2013.01); *H03F 19/00* (2013.01)

(58) Field of Classification Search
None
See application file for complete search history.

(56) References Cited

U.S. PATENT DOCUMENTS

| 2014/0193155 A1 | 7/2014 | Popovic et al. |
| 2017/0199443 A1 | 7/2017 | Vermeulen et al. |

(Continued)

OTHER PUBLICATIONS

Lemonde et al., "Enhanced nonlinear interactions in quantum optomechanics via mechanical amplification" Nature communications, 7:11338, pp. 1-8 (Year: 2016).*

(Continued)

*Primary Examiner* — Eric L Bolda
(74) *Attorney, Agent, or Firm* — Cozen O'Connor

(57) ABSTRACT

Optimally detuned parametric amplification amplifies a signal in a resonator that is driven off-resonance, with respect to a signal mode, using a far-detuned pump. This pump establishes a parametric drive strength, and is "far-detuned" in that its detuning from the signal mode is greater than the drive strength. The amplitude and frequency of the pump are chosen so that the eigenfrequency of the resulting Bogoliobov mode matches a photonic loss rate of the Bogoliobov mode. In this case, a signal coupled into the Bogoliobov mode will be amplified with a gain that is broader and flatter than that achieved with conventional parametric amplification, and is not limited by a gain-bandwidth product. Optimally detuned parametric amplification may be used for degenerate or non-degenerate parametric amplification, and may be used to amplify microwaves, light, electronic signals, acoustic waves, or any other type of signal that can be amplified using conventional parametric amplification.

20 Claims, 5 Drawing Sheets

(51) Int. Cl.
*G02F 1/31* (2006.01)
*G02F 1/39* (2006.01)
*H03F 3/189* (2006.01)

(56) References Cited

U.S. PATENT DOCUMENTS

2018/0067182 A1   3/2018   Clerk et al.
2018/0205463 A1   7/2018   Karpov et al.
2018/0341874 A1   11/2018  Puri et al.

OTHER PUBLICATIONS

PCT Application No. PCT/US2020/064735, International Search Report and Written Opinion dated Mar. 19, 2021, 8 pages.
Szorkovszky et al., Detuned Mechanical Parametric, Amplification as a Quantum Non-Demolition Measurement, New Journal of Physics, 16.4, p. 043023, Apr. 23, 2014.

* cited by examiner

OPTIMALLY DETUNED PARAMETRIC AMPLIFICATION, AND ASSOCIATED DEVICES

RELATED APPLICATIONS

This application claims priority to U.S. Provisional Patent Application No. 62/948,147, filed Dec. 13, 2019 and titled "Technologies for a Broadband Detuned Parametric Amplifier", which is incorporated herein by reference in its entirety.

STATEMENT REGARDING FEDERALLY SPONSORED RESEARCH OR DEVELOPMENT

This invention was made with government support under grant number FA9550-19-1-0362 awarded by the Air Force Office of Scientific Research. The government has certain rights in the invention.

BACKGROUND

Parametric amplification amplifies a weak signal using the energy from a pump. The pump drives a resonant mode of a resonator, typically by parametrically driving the resonator at the resonant frequency of the mode (i.e., sinusoidally varying, in time, a parameter of the resonator) or by exciting a nonlinear element within the resonator. This driving transfers energy from the pump to the resonator. The signal is also coupled to the resonator, where it extracts the pump energy from the excited mode of the resonator. For many applications, parametric amplification offers lower noise than amplification with a gain element (e.g., a transistor).

SUMMARY OF THE EMBODIMENTS

The present embodiments feature systems and devices that implement optimally detuned parametric amplification (ODPA). ODPA is similar to conventional parametric amplification in that a resonator is used to transfer power from a pump to a weak signal. However, unlike conventional parametric amplification, ODPA uses a far-detuned pump, i.e., the pump frequency is not resonant with any mode of the resonator. The present embodiments may be used for degenerate (i.e., phase-sensitive) parametric amplification, or non-degenerate (i.e., phase-insensitive) parametric amplification.

The behavior of the resonator in the presence of the far-detuned pump is described by a Hamiltonian (see Eqns. 1 and 14 below). By diagonalizing the Hamiltonian, the eigenmodes of the system, and their eigenfrequencies, are identified. These eigenmodes are known as Bogoliobov modes. The pump is "far-detuned" in that its frequency, relative to the resonant frequency of a signal mode of the resonator, is large compared to a parametric drive rate established in the pump. In this far-detuned regime, the amplitude and frequency of the far-detuned pump can be controlled so that the signal is amplified with any specified gain. Advantageously, the signal gain curve has a larger and flatter bandwidth, as compared to conventional parametric amplification (i.e., with the pump on resonance). Furthermore, the signal gain is not limited by a gain-bandwidth product, as is the case for conventional parametric amplification.

The frequency and amplitude of a pump can be readily tuned in almost any experimental setup. As a result, the present method embodiments may be readily implemented with almost any type of existing parametric amplifier system, including degenerate (i.e., phase-sensitive) and non-degenerate (i.e., phase-insensitive) parametric amplifiers.

One advantage of the present embodiments over conventional degenerate parametric amplification is that quantum-limited amplification without added noise can be achieved. Such amplification is required for many applications, such as quantum computation and quantum communication. In particular, the present embodiments may be implemented with Josephson parametric amplifiers that are used to read out superconducting quantum circuits.

However, the present embodiments may be used to amplify any type of signal that can be amplified using conventional parametric amplification, such as microwaves, light (e.g., infrared, visible, ultraviolet, etc.), electrical signals, and mechanical signals (e.g., acoustic signals, ultrasound). Accordingly, the present embodiments may find use in a host of applications, including optical communication, cavity optomechanics, radio astronomy, space and satellite communication, radar, and ultrasound transducers.

DETAILED DESCRIPTION OF THE EMBODIMENTS

Figure 1:
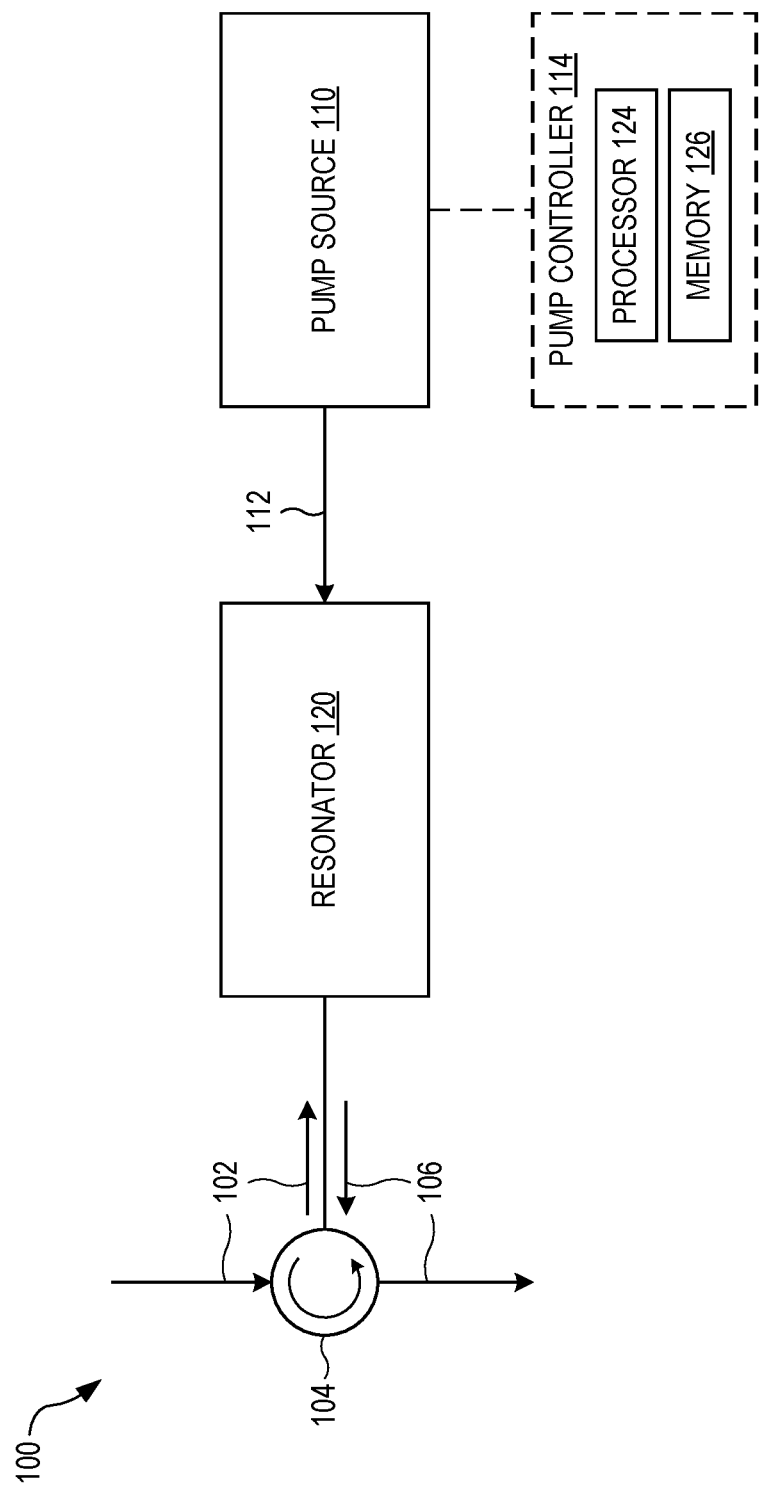
FIG. 1 shows an optimally detuned parametric amplifier amplifying a signal, in embodiments.

FIG. 1 shows an optimally detuned parametric amplifier 100 amplifying a signal 102 into an amplified signal 106. A circulator 104 couples the signal 102 into a resonator 120 such that the amplified signal 106 appears as an amplified reflection emitted by the resonator 120. To parametrically amplify the signal 102, a pump source 110 drives the resonator 120 with a far-detuned pump 112 that establishes a parametric drive strength v. The pump 112 is coherent, monochromatic, and sufficiently intense that depletion can be ignored. The parametric drive strength v is proportional to the amplitude of the pump 112, and therefore can be controlled by changing the amplitude, or power, of the pump 112.

In quantum optics, the parametric drive strength v is the rate (e.g., frequency or power) at which pump photons are created and annihilated in the resonator 120. For parametric amplification to occur, the far-detuned pump 112 adds energy to the resonator 120. To transfer this energy to the signal 102, the resonator 120 may contain a nonlinear element that is driven by the pump 112. In this case, the resonator 120 is nonlinear. Here, "linear" means that the equations of motion for the degrees of freedom of the resonator 120 are linear in the degrees of freedom, while still allowing the possibility that the corresponding linear coefficients are time dependent. The scale factor is the spring constant, which may vary in time. Accordingly, parametric amplification can be implemented with a linear resonator 120 by parametrically modulating the resonator 120 with the pump 112 (e.g., by changing the spring constant of a mechanical oscillator in time).

The resonator 120 has one or more resonant modes, one of which is referred to herein as the signal mode. A signal resonant frequency $\omega_0$ of the signal mode includes mean-field shifts induced by the far-detuned pump 112. The pump 112 has a detuning $\Delta_P$ that is defined relative to $\omega_0$, and the pump 112 is "far-detuned" in that the absolute value of $\Delta_P$ is greater than the parametric drive strength v.

As described in more detail below, the far-detuned pump 112, when driving the resonator 120, creates a normal Bogoliobov mode that is based on the signal mode. The Bogoliobov mode is "normal" in that it is an eigenmode of the resonator 120 when driven by the pump 112. The normal Bogoliobov mode has a corresponding Bogoliobov eigenfrequency that is different from $\omega_0$. The signal 102 couples into the normal Bogoliobov mode, where it is amplified with the energy of the pump 112. The parametric amplifier 100 may be used for both degenerate and non-degenerate parametric amplification, as described in examples below. When used for non-degenerate parametric amplification, an idler wave is also present in the parametric amplifier 100.

The present embodiments may be implemented with any type of wave that can be parametrically amplified. For example, the signal 102, and therefore the amplified signal 106, may be electromagnetic waves (i.e., photons). Specifically, the signal 102 may be a radio-frequency wave, microwave, infrared light, optical light, or ultraviolet light. However, the signal 102 may lie in a different region of the electromagnetic spectrum without departing from the scope hereof. The electromagnetic waves may propagate in free-space as radiation, or along a transmission line or waveguide. In this case, the resonator 120 may be an electromagnetic resonator, and the far-detuned pump 112 may also be an electromagnetic wave. Alternatively, the signal 102 may be a mechanical vibration (i.e., phonons), such as an acoustic signal or ultrasonic wave. In this case, the resonator 120 may be a mechanical resonator. The resonator 120 may also be, or include, a transducer to operate with different forms of energy. For example, the resonator 120 may be a crystal oscillator (e.g., quartz or sapphire) that mechanically resonates and uses the piezoelectric effect to convert between mechanical and electrical energies.

Examples of the resonator 120 include an optical cavity (e.g., Fabry-Perot cavity, ring cavity, etc.), an optical resonator (e.g., etalon), a microwave cavity, a microwave resonator, a superconducting resonator, a transmission-line resonator, a dielectric resonator, a resonant electrical circuit, and a micromechanical resonator. However, the resonator 120 may be any other type of resonator without departing from the scope hereof. The resonator 120 may include a nonlinear element that, when pumped by the far-detuned pump 112, establishes the parametric drive strength v needed for parametric amplification. For example, the resonator 120 may be a Fabry-Perot cavity with a nonlinear crystal or vapor therein. The nonlinear crystal may have a second-order $\chi^{(2)}$ susceptibility or a third-order $\chi^{(3)}$ susceptibility.

Figure 2:
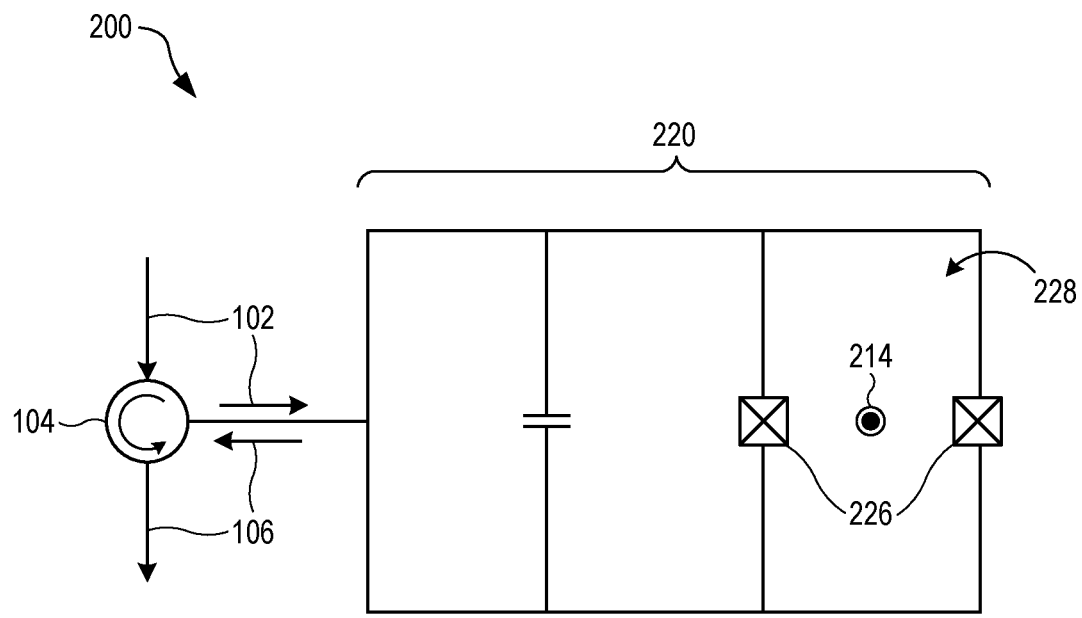
FIG. 2 shows an optimally detuned Josephson parametric amplifier implementing degenerate parametric amplification, in an embodiment.

FIG. 2 shows an optimally detuned Josephson parametric amplifier (JPA) 200 implementing degenerate parametric amplification. The JPA 200 is one example of the optimally detuned parametric amplifier 100 of FIG. 1. The JPA 200 uses a superconducting resonator 220 that includes a DC superconducting quantum interference device (SQUID) constructed from a pair of Josephson junctions 226 connected in parallel to form a superconducting loop 228. An oscillating magnetic flux 214 threads the superconducting loop 228 to parametrically drive the resonator 220. The superconducting resonator 220 is one example of the resonator 120 of FIG. 1, and the oscillating magnetic flux 214 is one example of the far-detuned pump 112 of FIG. 1.

Figure 3:
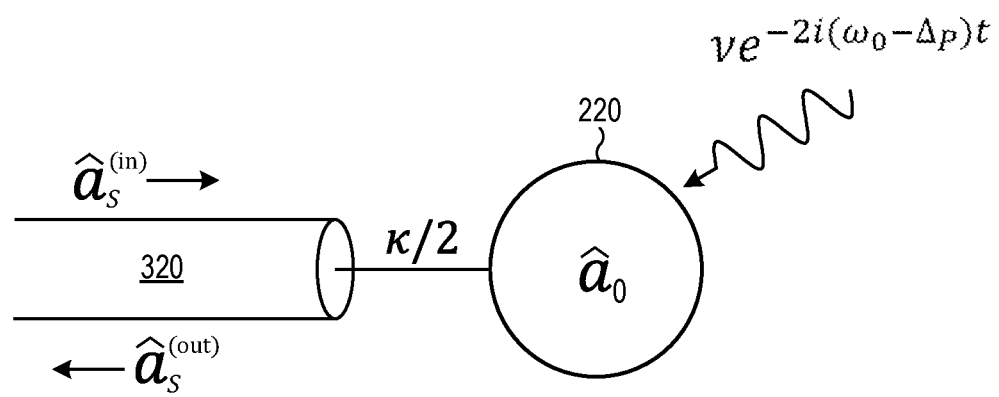
FIG. 3 illustrates operation of the Josephson parametric amplifier of FIG. 2 in the mean-field picture, in an embodiment.

FIG. 3 illustrates operation of the JPA 200 in the mean-field picture. The signal 102 excites a bosonic mode of a waveguide 320 whose annihilation operator is $\hat{a}_S^{(in)}$ while the amplified signal 106 excites a bosonic mode of the waveguide 320 whose annihilation operator is $\hat{a}_S^{(out)}$. The signal 102 couples into the signal mode of the superconducting resonator 220 with a coupling rate $\kappa/2$ (also referred to as a photonic loss rate). The annihilation operator of the signal mode is $\hat{a}_0$, and the corresponding creation operator is $\hat{a}_0^\dagger$. The far-detuned pump 112 drives the resonator 220 at a pump frequency $\omega_P = 2(\omega_0 - \Delta_P)$.

The far-detuned pump 112 creates, based on the signal mode, a normal Bogoliobov mode that is a linear superposition of $\hat{a}_0^\dagger$ and $\hat{a}_0$. The signal 102 is coupled into the Bogoliobov mode, where the signal 102 is amplified into the amplified signal 106 by extracting, from the signal mode, energy of a pair of identical photons. This extraction is mediated via the term $\hat{a}_0 \hat{a}_0$ of the Hamiltonian (see Eqn. 1 below).

As known in the art and discussed in more detail below, degenerate parametric amplification is phase-sensitive, i.e., dependent on the phase of the far-detuned pump 112 relative to the signal 102. Accordingly, the parametric amplifier 100 may include a phase shifter that shifts the phase of the pump 112, signal 102, or both. Examples of the phase shifter include a delay line (e.g., optical or microwave delay line, electro-optic phase shifter (e.g., a Pockels cell), an analog or digital microwave phase shifter, or any other component.

Figure 4:
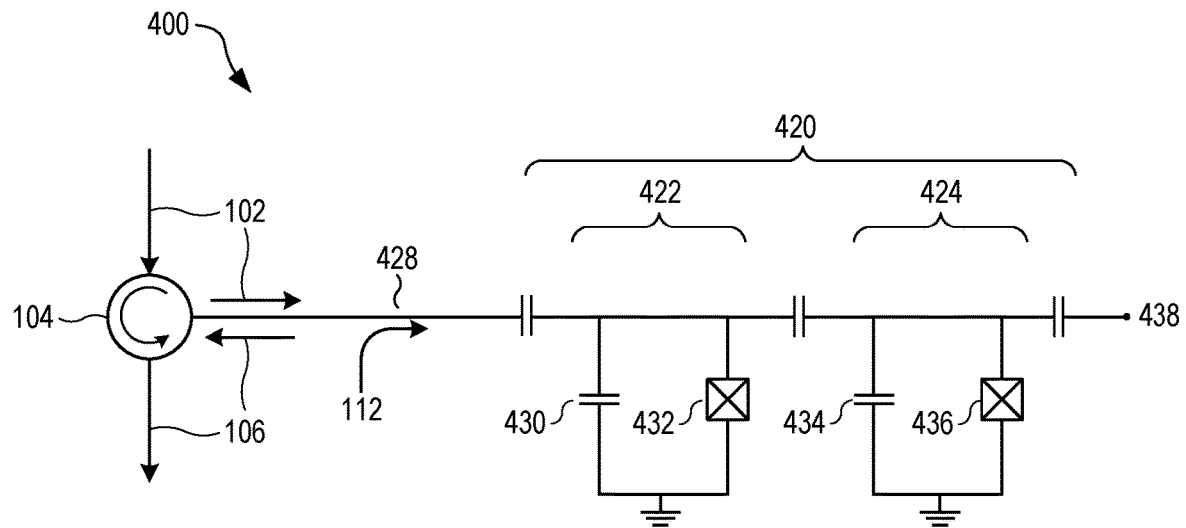
FIG. 4 shows an optimally detuned Josephson parametric amplifier implementing non-degenerate parametric amplification, in an embodiment.

FIG. 4 shows an optimally detuned Josephson parametric amplifier (JPA) 400 implementing non-degenerate parametric amplification. The JPA 400 is one example of the optimally detuned parametric amplifier 100 of FIG. 1. The JPA 400 uses a superconducting resonator 420 that is one example of the resonator 120 of FIG. 1. However, unlike the superconducting resonator 220 of FIG. 2, which has only one resonant mode, the superconducting resonator 420 has two resonant modes. Specifically, a signal mode 422 is constructed from a first Josephson junction 432 in parallel with a first capacitor 430, and an idler mode 424 is constructed from a second Josephson junction 436 in parallel with a second capacitor 434. The signal mode has a signal resonant frequency $\omega_0$, and the idler mode 424 has an idler resonant frequency $\omega_I$. The resonator 420 is nonlinear, having a $\chi^{(3)}$-type nonlinearity. In FIG. 4, the far-detuned pump 112 is electrically coupled into the superconducting resonator 420 via a directional coupler 428. The pump 112 excites both the signal and idler modes 422, 424. The idler mode 424 couples to an idler output 430, where the outputted idler may be discarded or used for another purpose.

Figure 5:
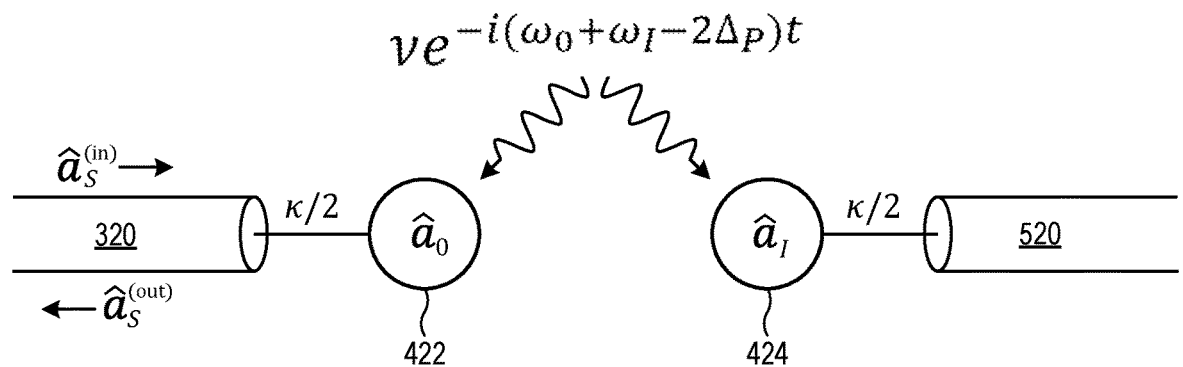
FIG. 5 illustrates operation of the Josephson parametric amplifier of FIG. 4 in the mean-field picture, in an embodiment.

FIG. 5 illustrates operation of the JPA 400 in the mean-field picture. Similar to FIG. 3, the signal 102 excites a bosonic mode of the waveguide 320 whose annihilation operator is $\hat{a}_S^{(in)}$ while the amplified signal 106 excites a bosonic mode of the waveguide 320 whose annihilation operator is $\hat{a}_S^{(out)}$. The signal 102 couples into the signal mode 422 with a coupling rate $\kappa/2$. The annihilation operator of the signal mode 422 is $\hat{a}_0$, and the corresponding creation operator is $\hat{a}_0^\dagger$. The annihilation operator of the idler mode 424 is $\hat{a}_I$, and the corresponding creation operator is $\hat{a}_I^\dagger$. The far-detuned pump 112 drives the resonator 420 at a pump frequency $\omega_P = \omega_S + \omega_I - 2\Delta_P$. This definition of pump frequency is used because of the $\chi^{(3)}$-type nonlinearity. The idler mode 424 couples to an idler waveguide 520 also with the coupling rate $\kappa/2$.

The far-detuned pump 112 creates, based on the signal and idler mode 422, 424, first and second normal Bogoliobov modes that are orthogonal to each other. Specifically, the first normal Bogoliobov mode is a linear superposition of $\hat{a}_0^\dagger$ and $\hat{a}_I$, and the second normal Bogoliobov mode is a linear superposition of $\hat{a}_I^\dagger$ and $\hat{a}_0$. The signal 102 couples into both the first and second normal Bogoliobov modes, where it is amplified into the amplified signal 106 by extracting energy from the signal and idler modes 422, 424. This extraction is mediated via the term $\hat{a}_0 \hat{a}_I$ of the Hamiltonian (see Eqn. 14 below). As known in the art, non-degenerate parametric amplification is phase-insensitive, and therefore operates independently of the phase of the far-detuned pump 112 relative to the signal 102. Therefore, no phase shifter is needed with the JPA 400.

JPAs 200 and 400 are two examples of the optimally detuned parametric amplifier 100 of FIG. 1 that may be used with superconducting circuits. These examples show that the far-detuned pump can be implemented as an oscillating magnetic flux or an electrical signal. However, JPAs come in wider variety of architectures than shown herein. Similarly, there are many additional techniques for driving a JPA with a pump. The present method embodiments may be used with any JPA architecture and pumping technique to advantageously increase gain bandwidth and gain flatness, and to operate without the constraint of a gain-bandwidth product.

One factor to consider with the present embodiments is the relationship between the pump frequency and the resonant modes. Some resonators have only one resonance (e.g., an L-C circuit), while others have multiple resonances (e.g., a Fabry-Perot cavity). The far-detuned pump 112 should not only be detuned from the signal mode, but from all other resonator as well. Accordingly, the resonator 120 may be designed and constructed with this requirement in mind. For example, a cavity resonator may be made physically small to have a large free-spectral range (i.e., frequency spacing between neighboring resonances). Furthermore, the resonator 120 may be designed so that its lowest-frequency resonance is the signal mode. In this case, red-detuning the pump from the signal mode will ensure that the pump frequency is far from any resonance.

Another factor to consider with the present embodiments is the power of the far-detuned pump 112. Since the pump 112 is far-detuned, a higher power level will be needed to achieve a desired gain, as compared to conventional parametric amplification. To achieve these higher power levels, a different pump source 110, or one or more power amplifiers, may be needed. In any case, a higher pump power in the resonator 120 will likely increase heat dissipation. The resonator 120 may need to be designed to withstand this extra heat, or used with a cooling system (e.g., liquid cooling, heat sink, etc.), to ensure reliable operation.

Conventional Degenerate Parametric Amplification

In degenerate parametric amplification (DPA), a single resonant bosonic mode of a resonator is driven by an external pump, which effectively creates and destroys pairs of quanta in the resonant mode. By adding pairs of quanta, the pump amplifies weak signals in the bosonic mode. Accordingly, this bosonic mode is also referred to as the "signal mode". The resonance frequency of the signal mode is $\omega_0$, and the frequency of the pump is $\omega_P$. In the frame rotating at $\omega_P/2$, the Hamiltonian of a parametric amplifier with a detuned pump is $$\hat{H} = \Delta_P \hat{a}_0^\dagger \hat{a}_0 + \frac{v}{2}(\hat{a}_0^\dagger \hat{a}_0^\dagger + \hat{a}_0 \hat{a}_0), \qquad (1)$$

where Planck's constant $\hbar$ has been set to 1, and $\hat{a}_0$ and $\hat{a}_0^\dagger$ are the annihilation and creation operators, respectively, of the signal mode. Both the pump detuning $\Delta_P = \omega_0 - \omega_P/2$ and drive $v$ can be set experimentally. Both $\Delta_P$ and $v$ are assumed to be real and positive.

To make use of the creation of quanta pair, the signal mode is coupled to an input-output waveguide with a coupling rate, or photonic loss rate, of $\kappa/2$. Signals incident on this waveguide $\hat{a}_S^{(in)}$ will be reflected with gain G. If the incident signal has a frequency $\omega_S$ and a complex amplitude $\beta$, the average of the reflected output field takes the form $$\langle \hat{a}_S^{(out)} \rangle [\Delta_S] = |\beta|(g[\Delta_S]e^{i\varphi} - g'[\Delta_S]e^{-i\varphi}), \qquad (2)$$

where $$g[\Delta_S] = \frac{\Delta_S^2 - \left(\Delta_P^2 - v^2 - \left(\frac{\kappa}{2}\right)^2\right) - i\kappa\Delta_P}{\Delta_S^2 - \left(\Delta_P^2 - v^2 + \left(\frac{\kappa}{2}\right)^2\right) + i\kappa\Delta_S}, \qquad (3)$$

$$g'[\Delta_S] = i\frac{\kappa v}{\Delta_S^2 - \left(\Delta_P^2 - v^2 + \left(\frac{\kappa}{2}\right)^2\right) + i\kappa\Delta_S}, \qquad (4)$$

$\Delta_S = \omega_S - \omega_P/2$ is the detuning of the incident signal, $|\beta|$ is the magnitude of the incident signal, and $\varphi = \arg(\beta)$ is the phase difference between the signal and the pump.

A degenerate parametric amplifier is phase-sensitive, meaning the output power $|\langle \hat{a}_S^{(out)} \rangle [\Delta_S]|^2$ depends on $\varphi$. To obtain large gain near $\Delta_S = 0$, it is conventional to define the power gain $G[\Delta_S]$ of the amplifier at a fixed phase difference $\varphi^*$ that maximizes the zero-shift gain, $G[\Delta_S = 0] \equiv G_0$, which leads to $$G[\Delta_S] = |g[\Delta_S]e^{i\varphi^*} - g'[\Delta_S]e^{-i\varphi^*}|^2. \qquad (5)$$

In standard degenerate parametric amplifiers, the operating point is one where the external pump is resonant with the resonator, i.e., the frequency of the pump $\omega_P$ is chosen to equal half the resonant frequency $\omega_0$ of the signal mode, or $\omega_P = \omega_0/2$. The pump detuning $\Delta_P$ then vanishes and the resonant gain $G_0$ (i.e., gain for $\Delta_S = 0$) is given by $$\sqrt{G_0} = \frac{\frac{\kappa}{2} + v}{\frac{\kappa}{2} - v}, \qquad (6)$$

where the phase $\varphi$ that maximizes the resonant gain $G_0$ is $\varphi^* = \pi/4$. The gain is then $$G[\Delta_S] = \frac{\left(\frac{\Delta_S}{D}\right)^2 + G_0}{\left(\frac{\Delta_S}{D}\right)^2 + 1}, \qquad (7)$$

where $D = \kappa/(\sqrt{G_0} + 1)$ is the effective bandwidth of the amplifier. Only signals with detuning $\Delta_S$ within a range of approximately D will be significantly amplified. This can be quantitatively captured via a 3 dB bandwidth, i.e., the frequency $\Gamma_{3\,dB}$ at which the gain G drops by a factor of one-half from its maximum value $G_0$. In the relevant case where the gain is very large, $G_0 \gg 1$, $$\Gamma_{3dB} \approx \frac{\kappa}{\sqrt{G_0}} \Longrightarrow \Gamma_{3dB}\sqrt{G_0} \approx \kappa. \tag{8}$$

This encapsulates the fundamental gain-bandwidth product that limits conventional parametric amplifiers. An increase in the peak gain is necessarily accompanied by a reduction in the operating bandwidth of the amplifier.

Optimally Detuned Parametric Amplification

Unlike conventional parametric amplification, optimally detuned parametric amplification (ODPA) does not make use of a pump with a frequency $\omega_P$ such that $\omega_P/2$ equals the resonator frequency $\omega_0$. As such, the pump detuning $\Delta_P$ does not vanish. In fact, the operating point for ODPA is such that $\omega_P/2$ is far-detuned from the resonant frequency $\omega_0$ of the signal mode, where "far-detuned" means that the pump detuning $\Delta_P$ is larger than the parametric drive strength v. In this case, the Hamiltonian can be diagonalized via a Bogoliobov transformation. The eigenfrequency of the Bogoliobov mode is $\sqrt{\Delta_P^2 - v^2}$.

To specify the parameters required for ODPA, consider a fixed decay rate $\kappa$ and a freely adjustable detuning $\Delta_P$ and drive strength v. For a desired resonant gain $G_0$, the ratio of the pump detuning and drive strength should satisfy $$\frac{v}{\Delta_P} = \frac{G_0 - 1}{G_0 + 1}. \tag{9}$$

However, another degree of freedom remains, namely the absolute magnitude of $\Delta_P$ and v. A useful choice is to match the eigenenergy of the Bogoliobov mode with the photonic loss rate, or $$\sqrt{\Delta_P^2 - v^2} = \frac{\kappa}{2}. \tag{10}$$

These choices fix $\Delta_P$ and v which, in terms of the photonic loss rate $\kappa/2$ and $G_0$, are now $$\Delta_P = \frac{\kappa}{4}\left(\sqrt{G_0} + \frac{1}{\sqrt{G_0}}\right), \tag{11}$$

$$v = \frac{\kappa}{4}\left(\sqrt{G_0} - \frac{1}{\sqrt{G_0}}\right). \tag{12}$$

Note that both the gain $G_0$ and photonic loss rate $\kappa$ are independent parameters.

The resonant gain $G_0$ occurs when the phase $\phi$ is real, so that $\phi^* = 0$. The gain now becomes $$G[\Delta_S] = \frac{\left(\frac{\Delta_S}{D^*}\right)^4 + G_0}{\left(\frac{\Delta_S}{D^*}\right)^4 + 1}, \tag{13}$$

where $D^* = \kappa/\sqrt{2}$ is the effective bandwidth of the optimally tuned amplifier.

Optimally detuned degenerate parametric amplification offers at least two distinct advantages over conventional degenerate parametric amplification. First, there is no gain-bandwidth limitation, i.e., the gain can be as large as desired without sacrificing bandwidth. This can be seen by computing the 3 dB bandwidth which, in the case where the resonant gain is large (i.e., $G_0 \gg 1$), equals the effective bandwidth $\Gamma_{3\,dB} = D^*$. The fact that the gain and bandwidth are independent is of enormous utility in experiments.

Second, the gain profile around zero signal detuning $\Delta_S$ is significantly flatter. In conventional DPA, the gain curve is only flat around a narrow range of signal detuning $\Delta_S$, which satisfy $\Delta_S \ll D$. In contrast, the gain of the present embodiments is nearly constant for signal detuning $\Delta_S$ near zero, with small leading-order correction on the order of $(\Delta_S/D^*)^4$.

Nondegenerate Parametric Amplification

The present embodiments can also be used for nondegenerate parametric amplification (NDPA). The setup is similar to that described above for degenerate parametric amplification, where a far-detuned pump adds pairs of quanta to the system. However, for the non-degenerate case, the two quanta are distinguishable. Similar to the degenerate case, the resonant mode used to amplify the inputted signal is referred to as the signal mode, and it has a signal resonant frequency $\omega_0$. The other resonant mode is referred to as the idler mode, and it has an idler resonant frequency $\omega_I$.

The Hamiltonian for NDPA in a joint rotating frame is $$\hat{H} = \Delta_P \hat{a}_0^\dagger \hat{a}_0 + \Delta_P \hat{a}_I^\dagger \hat{a}_I + v(\hat{a}_0^\dagger \hat{a}_I^\dagger + \hat{a}_0 \hat{a}_I), \tag{14}$$

where $\hat{a}_0$ and $\hat{a}_I$ are the annihilation operators of signal and idler quanta, respectively. As before, v is the parametric drive strength. The pump detuning is now defined $\Delta_P = (\omega_0 + \omega_I - \omega_P)/2$. Like the degenerate case, both the signal and idler modes are coupled to a waveguide with equal photonic loss rates $\kappa_0/2 = \kappa_I/2 \equiv \kappa/2$. When a signal of frequency $\omega_S$ is coupled into the resonator, corresponding to $\hat{a}_S^{(in)}$ with an amplitude $\beta$ and signal detuning $\Delta_S = \omega_S - (\omega_0 - \omega_I + \omega_P)/2$, the average of the reflected output is $$\langle \hat{a}_S^{(out)} \rangle [\Delta_S] = \beta \gamma [\Delta_S], \tag{15}$$

where $$\gamma[\Delta_S] = \frac{\Delta_S^2 - \left(\Delta_P^2 - v^2 - \left(\frac{\kappa}{2}\right)^2\right) - i\kappa\Delta_P}{\Delta_S^2 - \left(\Delta_P^2 - v^2 + \left(\frac{\kappa}{2}\right)^2\right) + i\kappa\Delta_S}. \tag{16}$$

Note that the nondegenerate parametric amplifier is phase-insensitive, meaning the output power $|\langle \hat{a}_S^{(out)} \rangle [\Delta_S]|^2$ does not depend on the phase $\varphi = \arg(\beta)$ of the input signal.

Like the degenerate case, the conventional operating point for NDPA is $\Delta_P = 0$. In this case, the resonant gain $G_0$ satisfies $$\sqrt{G_0} = \frac{\left(\frac{\kappa}{2}\right)^2 + v^2}{\left(\frac{\kappa}{2}\right)^2 - v^2}, \tag{17}$$

and the amplifier is limited by the standard gain-bandwidth product of $\sqrt{G_0}\Gamma_{3\,dB} \approx \kappa/2$.

In the present embodiments, the pump detuning $\Delta_P$ and parametric drive strength v are chosen so that the Bogoliobov-mode eigenfrequency $\sqrt{\Delta_P^2-v^2}$ matches the photonic loss rate κ/2. For a resonant gain $G_0$, the pump detuning $\Delta_P$ and drive strength v are $$\Delta_P = \frac{\kappa}{2}\sqrt{G_0} \quad (18)$$

$$v = \frac{\kappa}{2}\sqrt{G_0 - 1} \quad (19)$$

such that the gain becomes $$G[\Delta_S] = \frac{\left(\frac{\Delta_S}{D^*}\right)^4 + G_0}{\left(\frac{\Delta_S}{D^*}\right)^4 + 1}, \quad (20)$$

where $D^* = \kappa/\sqrt{2}$ is identical to that for the degenerate case. Thus, the pump detuning $\Delta_P$ and drive strength v can be selected to circumvent the gain-bandwidth product, i.e., increasing gain need not require decreasing the bandwidth over which that gain is applied. Like optimally detuned degenerate parametric amplification, optimally detuned non-degenerate parametric amplification is quantum-limited (i.e., only half a quantum of noise is added).

Figure 6:
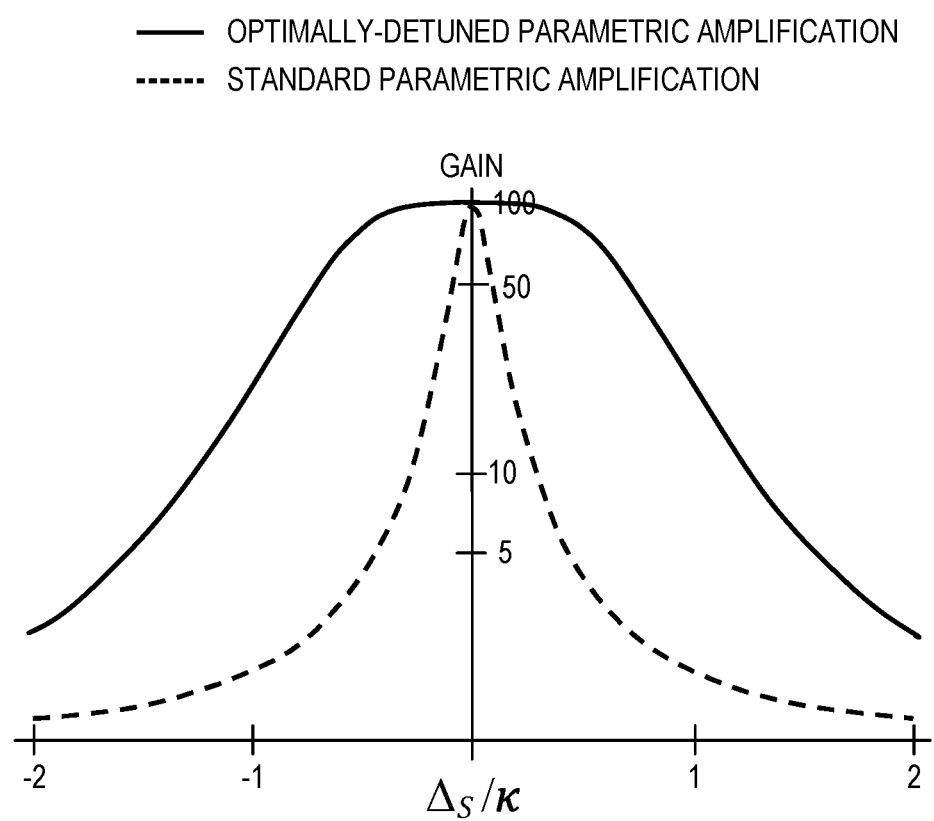
FIG. 6 is a graph of gain G versus normalized signal detuning $\Delta_S/\kappa$, in an embodiment.

FIG. 6 is a graph of gain G versus normalized signal detuning $\Delta_S/\kappa$. The resonant gain $G_0$ is the peak value of the gain G at $\Delta_S=0$. Specifically, G is power gain, whereas $\sqrt{G}$ is amplitude gain. The solid line in FIG. 6 is the gain of an optimally detuned parametric amplifier (e.g., see the optimally detuned parametric amplifier 100 of FIG. 1). The dashed line is the gain of a conventional parametric amplifier (i.e., with $\Delta_P=0$). As can be seen, the optimally detuned parametric amplifier has a gain profile that is flatter and wider near the signal resonance (i.e., $\Delta_S=0$), as compared to the gain profile of a conventional parametric amplifier.

Equating the Bogoliobov Eigenfrequency to the Photonic Loss Rate

To understand why the Bogoliobov eigenfrequency is set equal to the photonic loss rate (see Eqn. 10), it is convenient to rewrite Eqn. 2 to clarify the phase-sensitive behavior of the amplifier. To that end, by splitting the complex output field into its real and imaginary parts $\langle \bar{a}[\omega] \rangle^{(out)} \equiv \langle \bar{x}^{(out)}[\omega] \rangle + i\langle \bar{p}^{(out)}[\omega] \rangle$, Eqn. 2 can be expressed as $$\begin{pmatrix} \hat{x}^{(out)}[\omega] \\ \hat{p}^{(out)}[\omega] \end{pmatrix} = e^{i\varphi[\omega]} S^{-1} \begin{pmatrix} \cos(\theta[\omega]) & -\sin(\theta[\omega]) \\ \sin(\theta[\omega]) & \cos(\theta[\omega]) \end{pmatrix} S \begin{pmatrix} \cos(\phi) \\ \sin(\phi) \end{pmatrix} \quad (21)$$

where $$S = \begin{pmatrix} \left(\frac{\Delta_P+v}{\Delta_P-v}\right)^{-\frac{1}{4}} & 0 \\ 0 & \left(\frac{\Delta_P-v}{\Delta_P+v}\right)^{-\frac{1}{4}} \end{pmatrix} \quad (22)$$

is a broadband squeezing/amplification transformation and $$\varphi[\omega] = \arctan\left(\frac{\kappa\sqrt{\Delta_P^2-v^2}}{\Delta_P^2-v^2-\omega^2+\left(\frac{\kappa}{2}\right)^2}\right) \quad (23)$$

$$\theta[\omega] = \arctan\left(\frac{\kappa\sqrt{\Delta_P^2-v^2}}{\Delta_P^2-v^2-\omega^2-\left(\frac{\kappa}{2}\right)^2}\right) \quad (24)$$

are frequency dependent rotation angles.

Figure 7:
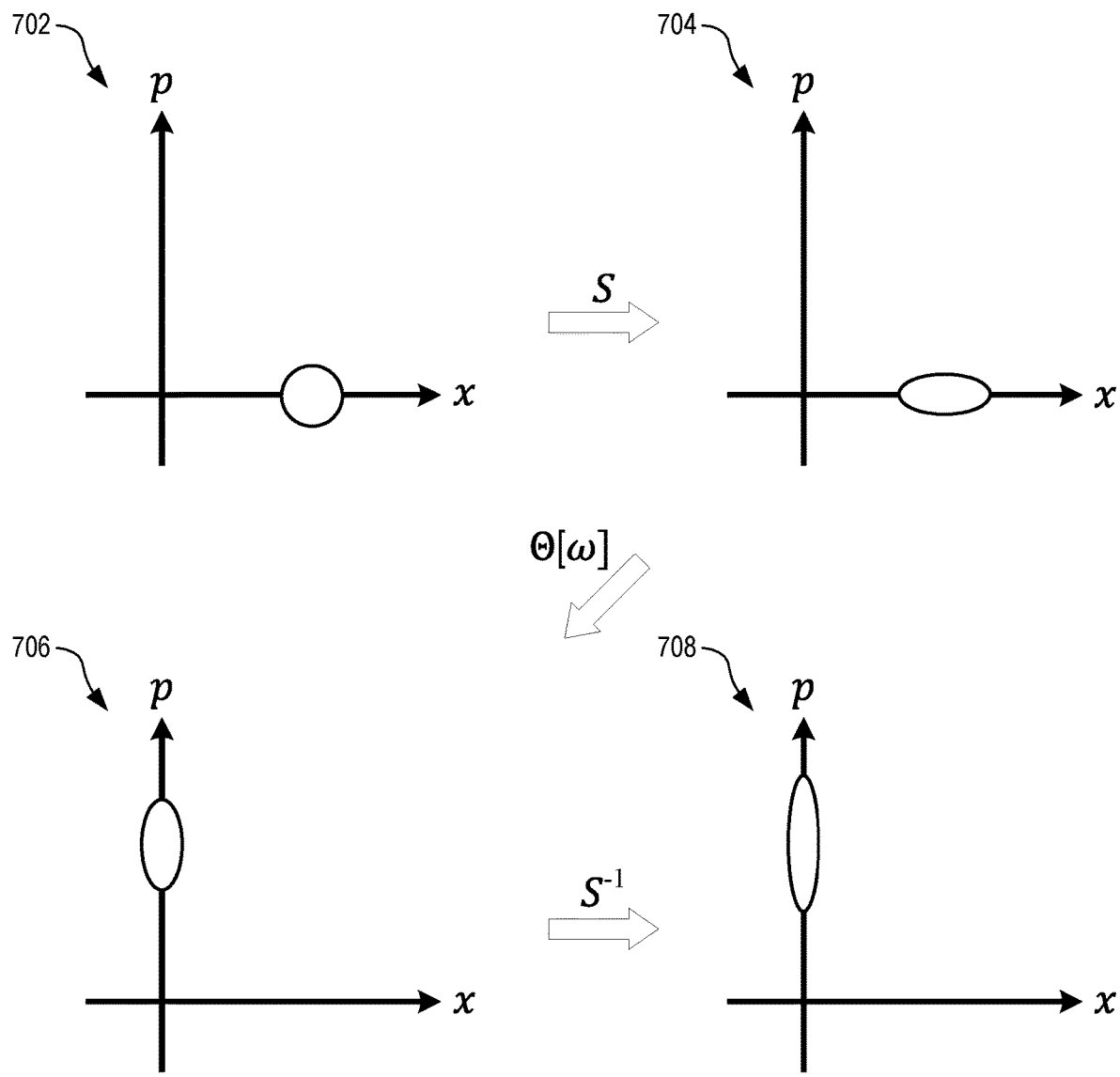
FIG. 7 shows phase-space transformations being used to determine the maximum amplification of the present embodiments

FIG. 7 shows phase-space transformations being used to determine the maximum amplification of the present embodiments. Starting from a first phase-space diagram 702, the squeezing transformation S of Eqn. 22 selects two orthogonal axes, and amplifies or attenuates along these axes. In the convention chosen here, S amplifies along the x axis and attenuates along the orthogonal p axis, as shown in a second phase-space diagram 704. A frequency-dependent rotation $\Theta[\omega]$ is then applied, as shown in a third phase-space diagram 706 for the case of a 90° rotation. The inverse squeezing transforming $S^{-1}$ then amplifies along the p axis and attenuates along the x axis. If $\theta[\omega]$ were 0, these two squeezing transformations would cancel, resulting in no amplification. However, when $\theta[\omega]=\pi/2$, these two transformations add, resulting in maximal amplification. To obtain the maximum amplification near zero frequency (in this rotating frame), $\theta[0]=\pi/2$. Eqn. 10 then follows from Eqn. 24.

Method Embodiments

In embodiments, a method for optimally detuned parametric amplification includes pumping a resonator with a far-detuned pump to establish a parametric drive strength. The method also includes coupling, during said pumping, a signal into the resonator to generate an amplified signal. In one example of the method, the optimally detuned parametric amplifier 100 of FIG. 1 includes a resonator 120 that amplifies the signal 102 into the amplified signal 106 while being driven with the far-detuned pump 112.

In some embodiments, pumping the resonator includes parametrically modulating the resonator. As an example of these embodiments, the oscillating magnetic flux 214 threads the superconducting loop 228 to parametrically modulate the superconducting resonator 220. In other embodiments, pumping the resonator includes pumping a nonlinear element of the resonator.

In some embodiments, the resonator generates the amplified signal using phase-sensitive parametric amplification of the signal. Degenerate parametric amplification is an example of phase-sensitive parametric amplification. Accordingly, in one example of these embodiments, the JPA 200 of FIG. 2 uses the superconducting resonator 220 to implement phase-sensitive, degenerate parametric amplification of the signal 102.

In some embodiments, pumping includes creating, based on a signal mode of the resonator, a normal Bogoliobov mode having a non-zero eigenfrequency that equals a photonic loss rate κ/2 of the normal Bogoliobov mode. The photonic loss rate of the normal Bogoliobov mode is the same as the photonic loss rate of the signal mode. In these embodiments, coupling of the signal into the resonator includes exciting the normal Bogoliobov mode.

In some embodiments, the far-detuned pump has a pump detuning $\Delta_P$, relative to a resonant frequency $\omega_0$ of the signal mode, that is larger than the parametric drive strength, i.e., $\Delta_P \gg v$. In one example of these embodiments, the oscillating magnetic flux 214 has a pump frequency $\omega_P$ such that the pump detuning is defined as $\Delta_P=\omega_0-\omega_P/2$. The pump detuning $\Delta_P$ is larger than the parametric drive strength v established by the oscillating magnetic flux 214.

In some of these embodiments, the method further includes selecting the pump detuning $\Delta_P$ based on the equation $\Delta_P = \kappa(\sqrt{G_0} + 1/\sqrt{G_0})/4$. Here, "based on the equation" means that the equation is used in any way to determine $\Delta_P$, including setting $\Delta_P$ to an exact value $\Delta_P^*$ that satisfies the equation. However, a different value of $\Delta_P$ may be selected to account for experimental limitations (e.g., instrument resolution) that may prevent the exact value $\Delta_P$ from being implemented. Accordingly, the selected value $\Delta_P$ may be "close to" the exact value $\Delta_P^*$ without departing from the scope hereof. These embodiments also include controlling an amplitude of the far-detuned pump to set the parametric drive strength based on the equation $v = \kappa(\sqrt{G_0} - 1/\sqrt{G_0})/4$.

In other embodiments, the method includes exciting, during said pumping, an idler in the resonator. In one example of these embodiments, the far-detuned pump 112 excites the idler mode 424 of the superconducting resonator 420. The method may further include coupling the idler out of the idler mode. For example, the idler mode 424 may be coupled to the idler output 438 to extract the energy of the idler mode 424 from the resonator 420.

In some embodiments, the resonator generates the amplified signal using phase-insensitive parametric amplification of the signal. Non-degenerate parametric amplification is an example of phase-insensitive parametric. Accordingly, in one example of these embodiments, the parametric amplifier 400 of FIG. 4 uses the superconducting resonator 420 to implement phase-sensitive, non-degenerate parametric amplification of the signal 102.

In some embodiments, pumping includes creating, based on signal and idlers mode of the resonator, first and second normal Bogoliobov modes that are orthogonal to each other. The first and second normal Bogoliobov modes have the same non-zero eigenfrequency that equals a photonic loss rate $\kappa/2$ of the first and second normal Bogoliobov modes. In these embodiments, coupling includes exciting the first and second normal Bogoliobov modes.

In some embodiments, the signal mode of the resonator has a signal resonant frequency $\omega_0$, the idler mode of the resonator has an idler resonant frequency $\omega_I$, and the far-detuned pump has a pump detuning $\Delta_P$ that is larger than the parametric drive strength. The pump detuning $\Delta_P$ may be defined relative to the signal resonant frequency $\omega_0$ and the idler resonant frequency $\omega_I$. In one example of these embodiments, the far-detuned pump 112 excites the signal and idler modes 422, 424 of the superconducting resonator 420. In this example, the pump detuning is defined as $\Delta_P = (\omega_0 + \omega_I - \omega_P)/2$. The pump detuning $\Delta_P$ is larger than the parametric drive strength v established by the pump 112.

In some embodiments, the method also includes selecting the pump detuning $\Delta_P$ based on the equation $\Delta_P = \kappa\sqrt{G_0}/2$, and controlling an amplitude of the far-detuned pump to set the parametric drive strength based on the equation $v = \kappa\sqrt{G_0 - 1}/2$.

System Embodiments

In embodiments, an optimally detuned parametric amplifier includes a resonator, a pump source for a pump source for generating a far-detuned pump that, when pumping the resonator, establishes a parametric drive strength. The resonator, when pumped by the far-detuned pump, amplifies a signal into an amplified signal. The optimally detuned parametric amplifier 100 of FIG. 1 is one example of these embodiments.

In some embodiments, the optimally detuned parametric amplifier includes a pump controller configured to control the pump source such that the far-detuned pump, when pumping the resonator, creates, based on a signal mode of the resonator, a normal Bogoliobov mode having a non-zero eigenfrequency that equals a photonic loss rate $\kappa/2$ of the Bogoliobov mode. In one example of these embodiments, the optimally detuned parametric amplifier 100 includes a pump controller 114 that cooperates with the pump source 110 to control the frequency $\omega_P$ of the far-detuned pump 112, the amplitude (or power) of the far-detuned pump 112, or both.

In some embodiments, the pump controller is further configured to control the pump source such the far-detuned pump has a pump detuning that is larger than the parametric drive strength. Here, the pump detuning may be defined relative to a resonant frequency of the signal mode (e.g., for degenerate parametric amplification). The pump detuning may be additionally defined relative to a resonant frequency of an idler mode of the resonator (e.g., for non-degenerate parametric amplification).

In some embodiments, the pump controller is further configured to control the pump source so that the far-detuned pump parametrically modulates the resonator. In one example of these embodiments, the pump source may be, or include, a frequency synthesizer or function generator that outputs an electrical signal at the pump frequency $\omega_P$. The electrical signal may be fed to a current loop that is located adjacent to the superconducting loop 228, and that generates the oscillating magnetic flux 214 that threads the superconducting loop 228.

In some embodiments, the pump controller is further configured to select the pump detuning $\Delta_P$ and parametric drive strength v. For example, the pump controller 114 may include a processor 124 and a memory 126 storing machine-readable instructions that, when executed by the processor 124, control the processor 124 to calculate values for v and $\Delta_P$ based on Eqns. 11 and 12. The zero-frequency gain $G_0$ may be inputted by a user and stored in the memory 126, and the photonic loss rate $\kappa/2$ of the Bogoliobov modes may also be stored in the memory 126.

The memory 126 may store additional machine-readable instructions that, when executed by the processor 124, control the processor 124 to determine, based on the calculated value of v, a target amplitude of the far-detuned pump 112 that establishes the calculated value of v. The memory 126 may store additional information about the resonator 120 that may be used to determine the target amplitude. The memory 126 may store additional machine-readable instructions that, when executed by the processor 124, control the pump controller 114 to output one or more amplitude control signals that set the amplitude of the pump 112 according to the target amplitude.

Similarly, the memory 126 may store machine-readable instructions that, when executed by the processor 124, control the processor 124 to determine, based on the calculated value of $\Delta_P$, a target frequency of the far-detuned pump 112 such that the pump 112 has the calculated value of $\Delta_P$. The memory 126 may store additional information about the resonator 120 that may be used to determine the target frequency. The memory 126 may store additional machine-readable instructions that, when executed by the processor 124, control the pump controller 114 to output one or more frequency control signals that set the pump frequency according to the target frequency.

Combination of Features

Features described above as well as those claimed below may be combined in various ways without departing from the scope hereof. The following examples illustrate possible, non-limiting combinations of features and embodiments described above. It should be clear that other changes and modifications may be made to the present embodiments without departing from the spirit and scope of this invention:

(A1) A method for optimally detuned parametric amplification includes pumping a resonator with a far-detuned pump to establish a parametric drive strength. The method also includes coupling, during said pumping, a signal into the resonator to generate an amplified signal.

(A2) In the method denoted (A1), said pumping may include parametrically modulating the resonator.

(A3) In either one of the methods denoted (A1) and (A2), said pumping may include pumping a nonlinear element of the resonator.

(A4) In any one of the methods denoted (A1) to (A3), the resonator may generate the amplified signal using phase-sensitive amplification of the signal.

(A5) In any one of the methods denoted (A1) to (A4), said pumping may include creating, based on a signal mode of the resonator, a normal Bogoliobov mode having a non-zero eigenfrequency that equals a photonic loss rate $\kappa/2$ of the Bogoliobov mode. Furthermore, said coupling may include exciting the normal Bogoliobov mode.

(A6) In the method denoted (A5), the far-detuned pump may have a pump detuning $\Delta_P$, relative to a resonant frequency $\omega_0$ of the signal mode, that is larger than the parametric drive strength.

(A7) In the method denoted (A6), the method may further include selecting the pump detuning $\Delta_P$ based on the equation $\Delta_P = \kappa(\sqrt{G_0} + 1/\sqrt{G_0})/4$, and controlling an amplitude of the far-detuned pump to set the parametric drive strength based on the equation $v = \kappa(\sqrt{G_0} - 1/\sqrt{G_0})/4$. Here, $\omega_P$ is a pump frequency of the far-detuned pump, $\Delta_P = \omega_0 - \omega_P/2$ is the pump detuning, $v$ is the parametric drive strength, and $\sqrt{G_0}$ is a resonant gain of an amplitude of the signal.

(A8) In any one of the methods denoted (A1) to (A3), the method may further include exciting, during said pumping, an idler in the resonator.

(A9) In any one of the methods denoted (A1), (A2), (A3), and (A8), the resonator may generate the amplified signal using phase-insensitive amplification of the signal.

(A10) In any one of the methods denoted (A1), (A2), (A3), (A8), and (A9), said pumping may include creating, based on signal and idlers mode of the resonator, first and second normal Bogoliobov modes that are orthogonal to each other. The first and second normal Bogoliobov modes have a non-zero eigenfrequency that equals a photonic loss rate $\kappa/2$ of the first and second normal Bogoliobov modes. Coupling includes exciting the first and second normal Bogoliobov modes.

(A11) In the method denoted (A10), the signal mode of the resonator has a signal resonant frequency $\omega_0$, the idler mode of the resonator has an idler resonant frequency $\omega_I$, and the far-detuned pump may have a pump detuning $\Delta_P$ that is larger than the parametric drive strength. The pump detuning $\Delta_P$ may be defined relative to the signal resonant frequency $\omega_0$ and the idler resonant frequency $\omega_1$.

(A12) In the method denoted (A11), the method further includes selecting the pump detuning $\Delta_P$ based on the equation $\Delta_P = \kappa\sqrt{G_0}/2$, and controlling an amplitude of the far-detuned pump to set the parametric drive strength based on the equation $v = \kappa\sqrt{G_0 - 1}/2$.

(B1) An optimally detuned parametric amplifier includes a resonator and a pump source for generating a far-detuned pump that, when pumping the resonator, establishes a parametric drive strength. The resonator, when pumped by the far-detuned pump, amplifies a signal into an amplified signal.

(B2) In the optimally detuned parametric amplifier denoted (B1), the optimally detuned parametric amplifier may further include a pump controller configured to control the pump source such that the far-detuned pump, when pumping the resonator, creates, based on a signal mode of the resonator, a normal Bogoliobov mode having a non-zero eigenfrequency that equals a photonic loss rate $\kappa/2$ of the Bogoliobov mode.

(B3) In the optimally detuned parametric amplifier denoted (B2), the pump controller may be further configured to control the pump source such the far-detuned pump has a pump detuning that is larger than the parametric drive strength, the pump detuning being defined relative to a resonant frequency of the signal mode.

(B4) In the optimally detuned parametric amplifier denoted (B3), the pump detuning may be additionally defined relative to a resonant frequency of an idler mode of the resonator.

(B5) In any of the optimally detuned parametric amplifiers denoted (B2) to (B4), the pump controller may be further configured to control the pump source so that the far-detuned pump parametrically modulates the resonator.

(B6) In any of the optimally detuned parametric amplifiers denoted (B1) to (B5), the resonator may include a nonlinear element that, when pumped with the far-detuned pump, establishes the parametric drive strength.

(B7) In the optimally detuned parametric amplifier denoted (B6), the nonlinear element may have a $\chi^{(2)}$-type nonlinearity or a $\chi^{(3)}$-type nonlinearity.

(B8) In any of the optimally detuned parametric amplifiers denoted (B1) to (B7), the resonator may be selected from the group consisting of: an optical cavity, a microwave resonator, a microwave cavity, a superconducting resonator, a transmission-line resonator, a dielectric resonator, a resonant electrical circuit, and a micromechanical resonator.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A method for optimally detuned parametric amplification, comprising:
    pumping a resonator with a far-detuned pump to establish a parametric drive strength; and
    coupling, during said pumping, a signal into the resonator to generate an amplified signal.

2. The method of claim 1, wherein said pumping includes parametrically modulating the resonator.

3. The method of claim 1, wherein said pumping includes pumping a nonlinear element of the resonator.

4. The method of claim 1, wherein the resonator generates the amplified signal using phase-sensitive amplification of the signal.

5. The method of claim 1, wherein:
said pumping including creating, based on a signal mode of the resonator, a normal Bogoliobov mode having a non-zero eigenfrequency that equals a photonic loss rate $\kappa/2$ of the Bogoliobov mode; and
said coupling includes exciting the normal Bogoliobov mode.

6. The method of claim 5, wherein the far-detuned pump has a pump detuning $\Delta_P$, relative to a resonant frequency $\omega_0$ of the signal mode, that is larger than the parametric drive strength.

7. The method of claim 6, further comprising:
selecting the pump detuning $\Delta_P$ based on the equation $\Delta_P = \kappa(\sqrt{G_0} + 1/\sqrt{G_0})/4$; and
controlling an amplitude of the far-detuned pump to set the parametric drive strength based on the equation $v = \kappa(\sqrt{G_0} - 1/\sqrt{G_0})/4$;
wherein:
$\omega_P$ is a pump frequency of the far-detuned pump;
$\Delta_P = \omega_0 - \omega_P/2$ is the pump detuning;
v is the parametric drive strength; and
$\sqrt{G_0}$ is a resonant gain of an amplitude of the signal.

8. The method of claim 1, further comprising exciting, during said pumping, an idler in the resonator.

9. The method of claim 8, wherein the resonator generates the amplified signal using phase-insensitive amplification of the signal.

10. The method of claim 8, wherein:
said pumping includes creating, based on signal and idlers mode of the resonator, first and second normal Bogoliobov modes that are orthogonal to each other, the first and second normal Bogoliobov modes having a non-zero eigenfrequency that equals a photonic loss rate $\kappa/2$ of the first and second normal Bogoliobov modes; and
said coupling includes exciting the first and second normal Bogoliobov modes.

11. The method of claim 10, wherein:
the signal mode of the resonator has a signal resonant frequency $\omega_0$;
the idler mode of the resonator has an idler resonant frequency $\omega_I$; and
the far-detuned pump has a pump detuning $\Delta_P$, relative to the signal resonant frequency $\omega_0$ and the idler resonant frequency $\omega_I$, that is larger than the parametric drive strength.

12. The method of claim 11, further comprising:
selecting the pump detuning $\Delta_P$ based on the equation $\Delta_P = \kappa \sqrt{G_0}/2$; and
controlling an amplitude of the far-detuned pump to set the parametric drive strength based on the equation $v = \kappa/\sqrt{G_0 - 1}/2$;
wherein:
$\omega_P$ is a pump frequency of the far-detuned pump;
$\Delta_P = (\omega_0 + \omega_I - \omega_P)/2$ is the pump detuning;
v is the parametric drive strength; and
$\sqrt{G_0}$ is a resonant gain of an amplitude of the signal.

13. An optimally detuned parametric amplifier, comprising:
a resonator; and
a pump source for generating a far-detuned pump that, when pumping the resonator, establishes a parametric drive strength;
such that the resonator, when pumped by the far-detuned pump, amplifies a signal into an amplified signal.

14. The optimally detuned parametric amplifier of claim 13, further comprising a pump controller configured to control the pump source such that the far-detuned pump, when pumping the resonator, creates, based on a signal mode of the resonator, a normal Bogoliobov mode having a non-zero eigenfrequency that equals a photonic loss rate $\kappa/2$ of the Bogoliobov mode.

15. The optimally detuned parametric amplifier of claim 14, wherein the pump controller is further configured to control the pump source such the far-detuned pump has a pump detuning that is larger than the parametric drive strength, the pump detuning being defined relative to a resonant frequency of the signal mode.

16. The optimally detuned parametric amplifier of claim 15, the pump detuning being additionally defined relative to a resonant frequency of an idler mode of the resonator.

17. The optimally detuned parametric amplifier of claim 14, wherein the pump controller is further configured to control the pump source such that the far-detuned pump parametrically modulates the resonator.

18. The optimally detuned parametric amplifier of claim 13, the resonator including a nonlinear element that, when pumped with the far-detuned pump, establishes the parametric drive strength.

19. The optimally detuned parametric amplifier of claim 18, the nonlinear element having a $\chi^{(2)}$-type nonlinearity or a $\chi^{(3)}$-type nonlinearity.

20. The optimally detuned parametric amplifier of claim 13, the resonator being selected from the group consisting of: an optical cavity, a microwave resonator, a microwave cavity, a superconducting resonator, a transmission-line resonator, a dielectric resonator, a resonant electrical circuit, and a micromechanical resonator.

* * * * *